United States Patent [19]
Brust et al.

[11] Patent Number: 4,780,669
[45] Date of Patent: * Oct. 25, 1988

[54] METHOD AND ARRANGEMENT FOR EVALUATING A TEST VOLTAGE BY MEANS OF A BANDWIDTH-LIMITED EVALUATION CIRCUIT

[75] Inventors: Hans D. Brust, Dudweiler; Johann Otto, Bad Toelz, both of Fed. Rep. of Germany

[73] Assignee: Siemens Aktiengesellschaft, Berlin and Munich, Fed. Rep. of Germany

[*] Notice: The portion of the term of this patent subsequent to Aug. 25, 2004 has been disclaimed.

[21] Appl. No.: 842,172

[22] Filed: Mar. 21, 1986

[30] Foreign Application Priority Data

Mar. 22, 1985 [DE] Fed. Rep. of Germany ....... 3510530

[51] Int. Cl.[4] ................. G01R 31/02; G01R 31/28
[52] U.S. Cl. ................. 324/158 R; 250/311; 324/73 R
[58] Field of Search ............ 250/310, 317, 396 R, 250/492.2; 324/158 R, 158 D, 73 PC, 73 R, 71.3; 356/328, 326, 398, 394

[56] References Cited

U.S. PATENT DOCUMENTS

| | | | |
|---|---|---|---|
| 3,578,866 | 5/1971 | Kohler | 356/328 |
| 3,930,727 | 1/1976 | Vergata | 356/326 |
| 4,286,154 | 8/1981 | Okubo et al. | 250/310 |
| 4,563,642 | 1/1986 | Munakata et al. | 324/158 D |
| 4,689,555 | 8/1987 | Brust et al. | 324/158 R |

FOREIGN PATENT DOCUMENTS

| | | |
|---|---|---|
| 3420269 | 5/1984 | Fed. Rep. of Germany . |
| 3420272 | 5/1984 | France . |
| 0024585 | 2/1977 | Japan .................. 250/310 |
| 1517110 | 7/1978 | United Kingdom . |

OTHER PUBLICATIONS

"Voltage Comparator System for Contactless Microcircuit Testing", by DeStafeno et al., *IBM Tech. Disc. Bull.*, vol. 17, #10,3175, pp. 2871-2873.

"Rapid Display of High-Speed SEM Voltage Contrast Waveform", by Malm, *IBM Tech. Disc. Bull.*, vol. 21, #7, 12/78, pp. 2982-2984.

*Primary Examiner*—Reinhard J. Eisenzopf
*Assistant Examiner*—W. Burns
*Attorney, Agent, or Firm*—Hill, Van Santen, Steadman & Simpson

[57] ABSTRACT

Evaluating method and apparatus for a test voltage by use of a bandwidth-limited evaluation circuits. For evaluation of a measured signal dependent on a variable parameter, an identification is first undertaken with a broad-band evaluation circuit to determine whether an interesting sub-region of the overall variation region of the parameter has been reached. When this is the case, then a reduction of the bandwidth of the evaluation circuit and a reduction of the variation rate of the parameter occurs in order to be able to evaluate with high sensitivity in the interesting sub-region.

10 Claims, 2 Drawing Sheets

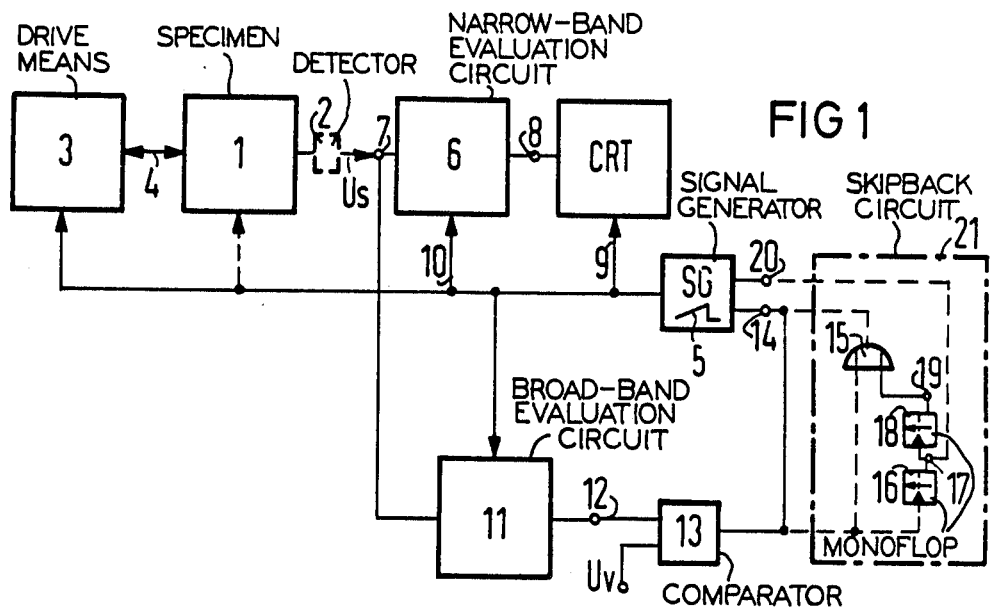
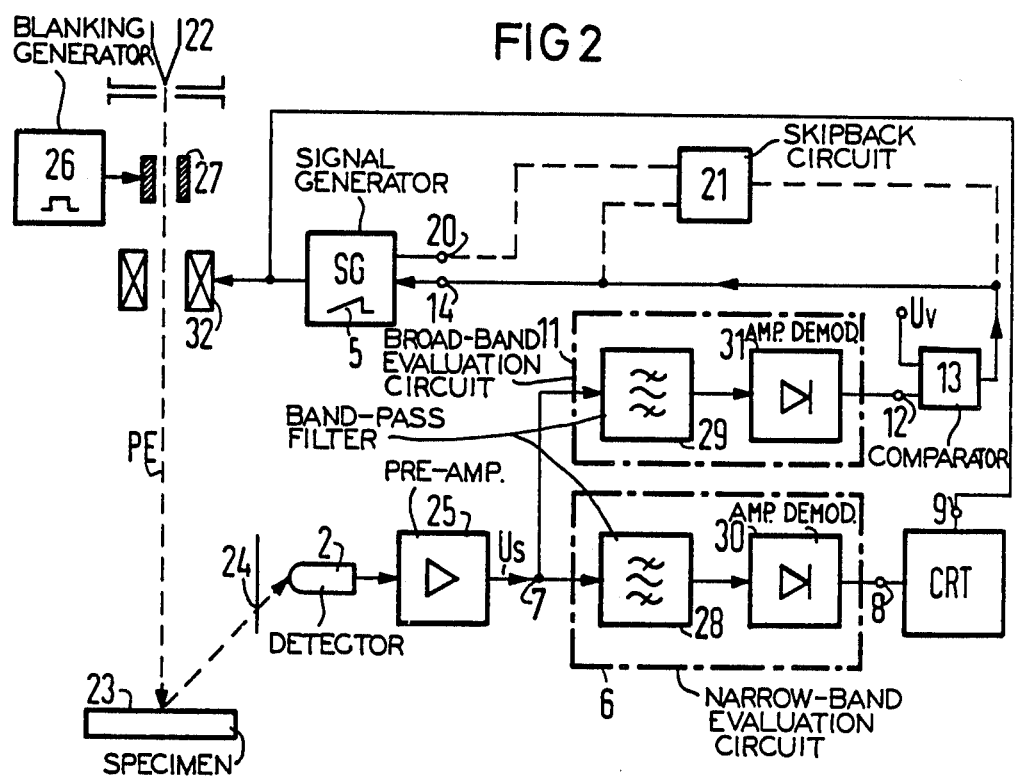

METHOD AND ARRANGEMENT FOR EVALUATING A TEST VOLTAGE BY MEANS OF A BANDWIDTH-LIMITED EVALUATION CIRCUIT

RELATED CASES

This application is related to the following cases: U.S. Ser. No. 837,813 filed Mar. 10, 1986 issued Aug. 23, 1987, U.S. Pat. No. 4,687,555; U.S. Ser. No. 717,104, U.S. Pat. No. 4,745,362 filed Mar. 28, 1985 issued July 7, 1987, U.S. Pat. No. 4,678,988; U.S. Ser. No. 717,115, filed Mar. 28, 1985; and U.S. Ser. No. 760,574, filed July 30, 1985.

BACKGROUND OF THE INVENTION

The invention relates to a method and arrangement for evaluating a test voltage by means of a bandwidth-limited evaluation circuit wherein the test voltage depends on a parameter variable within a defined variation width during the evaluation.

In measuring methods of this type, the evaluation circuit must be fashioned as narrow-banded as possible in order to achieve a high sensitivity. This, however, considerably reduces the measuring speed. If, conversely, one wishes to achieve a short measuring time, then the bandwidth of the evaluation circuit must be increased, and thus a reduction of the sensitivity must be accepted.

SUMMARY OF THE INVENTION

An object of the invention is to specify a method of the type initially discussed with which a reduction in the measuring time is achieved without a simultaneous reduction of the sensitivity. This object is achieved by providing a relatively narrow-band first evaluation circuit and a relatively broad-band second evaluation circuit similar to the first circuit. An output signal of the second evaluation circuit is employed for a switch-over of a change rate of the parameter from a higher to a lower value. The switch-over occurs for a duration of an appearance of an output signal from the second evaluation circuit. An output signal of the first evaluation circuit is employed for the evaluation.

Alternatively, a variable-bandwidth, first evaluation circuit is employed operating in a broad-band operating mode while a relatively high change rate is provided for the variable parameter. An output signal appearing at the first evaluation circuit is employed for undertaking a switch-over of the first evaluation circuit into a narrow-band operating mode during appearance of the output signal. The change rate of the variable parameter is switched from the higher to a lower change rate during the switch-over. The output signal from the first evaluation circuit is then employed for evaluation.

The method of the invention is particularly distinguished in that only the interesting regions of the variation width of the parameter are traversed at relatively low change speed, whereas a high change speed is present in the remaining regions. A considerable reduction of the measuring time thus results. However, this does not lead to a reduction of the measuring sensitivity because an evaluation of the test voltage by means of a narrow-banded evaluation circuit or an evaluation circuit switched in narrow-banded fashion occurs for the duration of the switch-over to the lower change speed.

BRIEF DESCRIPTION OF THE DRAWINGS

FIG. 1 illustrates a fundamental arrangement for the implementation of the method of the invention;

FIG. 2 shows an arrangement suitable for the implementation of the method of the invention in the field of electron beam-induced luminescent measurement.

DESCRIPTION OF THE PREFERRED EMBODIMENTS

Figure 3:
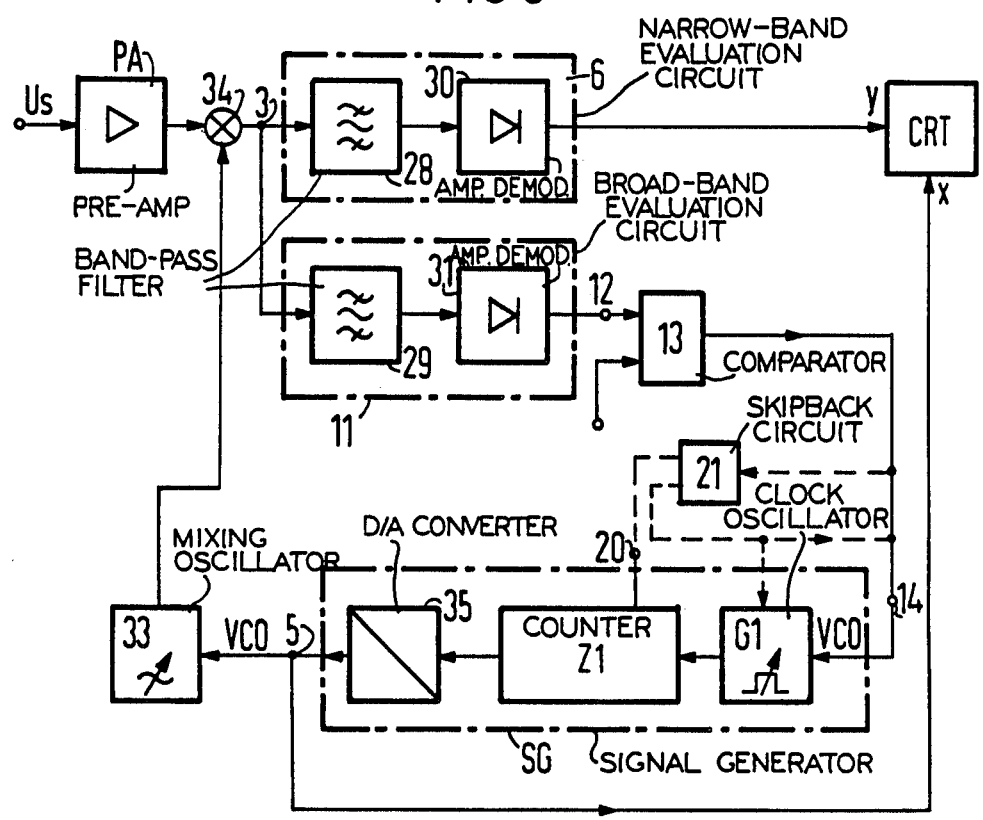
FIG. 3 illustrates an arrangement for the implementation of the method of the invention in spectral analysis of a measured signal.

FIG. 1 proceeds on the basis of a measured signal Us whose amplitude and/or frequency permits a statement regarding arbitrary properties of a unit under test or specimen 1 to be measured, these properties being dependent on a variable parameter. When a non-electrical measured signal is output by the specimen 1, then this can be converted into an electrical signal in a detector 2. In particular, the specimen 1 can be driven or stimulated e.g. with electrical signals which are generated by a drive means 3 and are supplied to the specimen via a line 4. The parameter is controlled in size or effectiveness by means of a signal generator SG which emits a ramp or step signal 5. The steepness of the rising edge of the signal 5 thus determines the change rate of the parameter.

The measured signal Us is supplied to a narrow-band evaluation circuit 6 via the input 7, is selected therein, and is processed into an output signal (in particular, it is demodulated and/or rectified) which is applied to the intensity control input 8 or to some other control input of a picture tube CRT. At least one of the two deflection means of the CRT can be driven by the signal generator SG via a line 9. Furthermore, the evaluation circuit 6 of signal generator SG can also be driven, this being indicated by the line 10. In particular, the evaluation circuit 6 can contain a narrow-band bandpass filter tuneable over a frequency range, the center frequency thereof being dependent on the respective amplitude of the voltage at line 10.

A second evaluation circuit 11 is essentially fashioned like the evaluation circuit 6 but is more broad-banded. Its input is at the circuit point 7 and is thus connected in parallel to the evaluation circuit 6 at the input side, or receives its input signal from the evaluation circuit 6. This also relates to the drive by the signal generator SG. The output signal appearing at the output 12 of circuit 11 proceeds to a comparator 13 (as a switching system) supplied with a comparison voltage Uv which is variable. When the output signal of circuit 11 exceeds the value of Uv, then it proceeds to a control input 18 of the signal generator SG.

In accordance with the method of the invention, for example, the parameter influencing the amplitude of Us is varied by the output voltage 5 of the signal generator SG during the course of the evaluation of Us. The evaluation of Us should thus only be of interest within one or more sub-regions within the change width of the parameter, whereas the measured signal Us contains no interesting information in the remaining sub-regions (in particular, its amplitude is zero). One then proceeds such that the change rate of the parameter defined by signal generator SG is initially selected extremely high. The high change rate thus approximately corresponds to a maximum value prescribed by the bandwidth of circuit 11. As soon as one arrives in the interesting sub-region of the parameter, however, an output signal is obtained at the output 12 which serves the purpose of switching the signal generator SG to a lower change rate for the parameter. As a consequence of the slow change of the parameter, Us is thus evaluated with high sensitivity in the narrow-band first evaluation circuit 6. The output signal thus appearing is employed for the control, particularly for the intensity control, of the picture tube CRT. When the interesting sub-region within the variation width of the parameter is again departed from, then the output signal at the circuit point 12 disappears, so that the control input 14 is also disconnected from this signal and SG is again switched to a high change rate for the parameter. Although the overall measuring time is very substantially reduced as a result of this, the evaluation of Us in the sub-regions of the variation width which are truly of interest is executed in narrow-banded fashion and, therefore, with high sensitivity.

In accordance with another embodiment of the arrangement of FIG. 1, the first evaluation circuit 6 can be variable in bandwidth. It thus initially functions in a broad-banded operating mode, whereby the signal generator SG is set to a high change rate of the parameter. During the appearance of an output signal at the output of 6, an input of this evaluation circuit is then selected with this signal, whereby a switch-over of the first evaluation circuit 6 into a narrow-banded operating mode occurs. Simultaneously, the input 14 of signal generator SG is also selected via the output of 6, so that signal generator SG is switched by the output signal to a lower change rate for the parameter. The further evaluation of the output of first evaluation circuit 6 occurs in the fashion already set forth.

In accordance with a further development of the arrangement of FIG. 1, the output 12 can also be connected to the first input of an OR gate 15 whose output is applied to the control input 14 of signal generator SG. In this case, the output 12 is also connected to the clock input of a monoflop 16 whose output 17 is connected to the clock input of a second monoflop 18. The output 19 of the latter is applied to a second input of the gate 15. The output 17, finally, is connected to a second control input 20 of signal generator SG via which the change direction for the parameter can be reversed. As soon as an output signal of the broad band evaluation circuit 11 is received, the monoflop 16 flips and supplies a signal via 17 which effects a reversal of the change direction of the parameter and likewise effects the reversal of the running direction of the electron beam of the CRT. The length of the signal emitted by 16 thus determines the degree of the skipback deriving for the parameter and the electron beam. This skipback is preferably undertaken with a high change rate. After the conclusion of the skipback, the parameter is again changed in the original direction and the electron beam is again deflected in the original direction. The electron beam can be blanked during the skipback. The monoflop 18 triggered by the trailing edge of the signal emitted via 16 thereby emits a signal within its time element which is supplied to the control input 20 of signal generator SG and effects a slow change rate, even when, due to the skipback, an output signal is no longer present at the output 12. As a result of this development, the precision of the evaluation at the immediate boundaries of the interesting subregions within the variation width can be prevented from being reduced due to the high change rate of the parameter.

FIG. 2 shows an arrangement for the implementation of the method of the invention given a cathode luminescence measurement. The electrons emerging from an electron source 22 thus form a primary beam PE. When this beam impinges a point on a specimen 23, then primary electrons penetrating into the specimen briefly place some of the specimen atoms into an excited condition. The transition into the fundamental condition can then occur in radiant fashion, i.e. the corresponding specimen atom emits its excess energy as a photon. The arising light radiation can be registered and allows conclusions regarding band structures and energy levels. When only light of one specific wavelength which is generated by a very specific transition is filtered out by a filter 24, then various types of atoms can be distinguished. A detector serves the purpose of documenting the light waves filtered out, this detector containing a photomultiplier which emits a secondary electrical signal which, after amplification in a pre-amplifier 25, is available as measured signal Us. Since the generated light intensity is very low, the primary beam PE is frequently intensity-modulated with a frequency F, this occurring by means of a blanking generator 26 and a modulation means 27. The frequency F is selected from the measured signal Us by means of two band-pass filters 28 and 29 contained in the evaluation circuits 6 and 11, the center frequencies of the band-pass filters respectively coinciding with F. The filters 28 and 29 are respectively followed by amplitude demodulators 30 and 31. The parameter influencing Us is thus the location of the specimen which is respectively impinged by the primary beam PE. Furthermore, signal generator SG, which is referred to as a scan generator in this case, influences the deflection systems 32 of the scanning electron microscope such that PE scans the specimen in individual lines. Via the line 9, the electron beam of the CRT is also deflected such that it sweeps the picture screen in corresponding lines. In this way, the distribution of a specific substance in an inhomogeneous specimen 23 is imaged on the picture screen of the CRT by the evaluation of Us.

The purpose of matching the change rate of the parameter, i.e. of the scan rate in this case, to the respectively interesting and non-interesting sub-regions within the variation width of the parameter is served by the broad band evaluation circuit 11 which appropriately drives the input 14 of the scan generator SG. When an output signal appears at the output 12, then the respective location on the specimen is slowly scanned. Otherwise, it is quickly scanned.

FIG. 3 shows the application of the method of the invention to the spectral analysis of a high-frequency measured signal Us. After amplification in a pre-amplifier PA, this is mixed onto a fixed intermediate frequency with the assistance of a mixing oscillator 33 and a mixing stage 34. Both the narrow-band band-pass filter 28 as well as the broad-band band-pass filter 29 in the evaluation circuits 6 and 11 are tuned to this fixed intermediate frequency. The mixing oscillator is swept in frequency by the ramp or step signal 5 of the signal generator SG. The one deflection system of the picture tube CRT is driven with the signal 5 and the other is driven with the output signal of the evaluation circuit 6. The individual frequencies of the measured signal Us found by sweeping the mixing oscillator can then be perceived on the picture screen as excursions from a frequency axis. The non-interesting frequency regions to be quickly swept are discriminated from the frequency regions in which spectral components of Us are suspected and which are therefore to be slowly swept. They are discriminated via a switch-over of the sweep rate of the mixing oscillator controlled by the output 12.

The skipback circuit referenced 21 in FIG. 1 which effects a skipback of the respective parameter can be employed analogously in the arrangements of FIGS. 2 and 3.

FIG. 3 shows a practical embodiment of the signal generator SG. This is formed of a clock oscillator G1 which is influenced in clock frequency by a signal at the input 14. G1 can also be referred to as a VCO (voltage controlled oscillator). A following counter Z1 counts the clock pulses emitted by G1, whereby an analog signal corresponding in amplitude to the respective counter result is derived via a digital-to-analog converter 35. Particularly given a periodic resetting of Z1 to an initial value, this represents the ramp or step signal 5. For the purpose of reversing the change direction of the parameter, the input 20 is supplied with a signal which reverses the counting direction of Z1.

The arrangement set forth above having only a single bandwidth-variable evaluation circuit can be analogously transferred to the arrangements of FIG. 2 and FIG. 3.

Instead of the picture tube CRT, any other recording means, particularly a computer or an xy-plotter, can also be employed.

The switching of the bandwidth can occur both in discrete steps as well as continuously.

In a modification of the method set forth up to now, the parameter can also be first varied in a first variation sequence and the output signal of the first or second evaluation circuit can be intermediately stored. In a second evaluation sequence which now need only cover the interesting variation regions, the stored signal can then be employed for changing the variation rate of the parameter and, under given conditions, for varying the bandwidth of the first evaluation circuit.

In a modification of the arrangement set forth up to now, the evaluation circuit need not necessarily be a purely electrical system. When, for instance, the specimen supplies non-electrical signals, then other processing systems, particularly optical processing systems, can be employed, particularly for selection. A conversion into an electrical signal for registration can subsequently ensue, particularly by means of a detector. Furthermore, the two evaluation circuits need not be completely connected in parallel, but rather can use common components (in FIG. 2, for example, the filter 24).

In FIG. 2, the scanning electron microscope can also be replaced by any other scanning microscope, for example a laser scanning microscope whose primary beam is capable of inducing luminescence.

Although various minor changes and modifications might be proposed by those skilled in the art, it will be understood that we wish to include within the claims of the patent warranted hereon all such changes and modifications as reasonably come within our contribution to the art.

We claim as our invention:

1. A method for evaluating a measured signal which depends on scan rate of a particle beam scanning the specimen, comprising steps of:
    providing a particle beam which is incident on a specimen;
    providing a detector for deriving a measured signal dependent on the scan rate a detector from photons emitted in said specimen upon incidence of the particle beam thereon, the photons being emitted by transition of specimen atoms from an excited into a fundamental condition;
    intensity-modulating said particle beam with a pulse frequency;
    providing a relatively narrow-band first evaluation circuit and a relatively broad-band second evaluation circuit, and tuning said first and second evaluation circuits to said pulse frequency;
    employing a scan generator for deflecting said particle beam across said specimen;
    employing an output signal of said second evaluation circuit for a switch-over of the scan rate of the particle beam from a higher to a lower value, said switch-over occurring for a duration of an appearance of said output signal from the second evaluation circuit; and
    employing an output signal of the first evaluation circuit for evaluation by supplying it to a display unit having deflection systems driven by the scan generator.

2. A method according to claim 1 including the steps of first intermediately storing output signals of said second evaluation circuit obtained during a first sequence of said scan rate and then employing the stored output signals during a second sequence of said scan rate for switching the scan rate.

3. A system for evaluating a measured signal from a detector wherein said measured signal depends on a scan rate of a particle beam scanning a specimen, said scan rate being variable within a defined range during said evaluation, comprising:
    a detector means for outputting a measured signal resulting from the scanning of the specimen;
    a relatively narrow-band first evaluation circuit connected to receive the measured signal from the detector means;
    a relatively broad-band second evaluation circuit similar to the first circuit connected to receive the measured signal from the detector means;
    signal generator means for providing a scan rate of said particle beam;
    switch-over means connecting an output of the second evaluation circuit to a control input of the signal generator means for switching-over a scan rate of said particle beam from a higher to a lower value dependent on a broad band output thereof; and
    evaluation means connected to receive an output signal from said first evaluation circuit for evaluation of the measured signal.

4. A system according to claim 3 wherein the switch-over means comprises a comparator and the first and second evaluation circuits are connected in parallel at their respective inputs.

5. A system according to claim 3 wherein at least one of said evaluation circuits is formed of a band-pass filter and a following demodulator.

6. A system according to claim 3 wherein said evaluation means comprises a picture tube, and said signal generator means comprises a scan generator connected to at least one deflection means for an electron beam of the picture tube, and wherein said picture tube has a control input connected to the output of said first evaluation circuit.

7. A system according to claim 3 wherein said switch-over means includes means for effecting a chronologically limited reverse of an original change direction of an output voltage of the signal generator means followed by a subsequent reswitching back to the original change direction, the switching of the scan rate from the higher to the lower value occurring together with said reswitching.

8. A system according to claim 3 wherein the switch-over means comprises a comparator.

9. A system for evaluating a measured signal from a detector wherein said measured signal depends on a scan rate of a particle beam scanning a specimen, said scan rate being variable within a defined range during said evaluation, comprising:
- a detector means for outputting a measured signal resulting from the scanning of the specimen;
- a relatively narrow-band first evaluation circuit connected to receive the measured signal from the detector means;
- a relatively broad-band second evaluation circuit similar to the first circuit connected to receive the measured signal from the detector means;
- signal generator means for providing a scan rate of said particle beam;
- switch-over means connecting an output of the second evaluation circuit to a control input of the signal generator means for switching-over a scan rate of said particle beam from a higher to a lower value dependent on a broad band output thereof;
- evaluation means connected to receive an output signal from said first evaluation circuit for evaluation of the measured signal;
- said switch-over means including via means for effecting a chronologically limited reverse of an original change direction of an output voltage of the signal generator means followed by a reswitching back to the original change direction, the switching of the scan rate from the higher to the lower value occurring together with said reswitching; and
- said means for effecting comprising a monoflop connecting to a logic gate whose output connects to another control input of the signal generator means.

10. A system for evaluating a measured signal from a specimen which is scanned by an electron beam, the measured signal being dependent on a scan rate of the electron beam, comprising:
- electron beam generator means for generating the electron beam;
- blanking generator means having a frequency F arranged for blanking the electron beam;
- deflection means for scanning the electron beam across the specimen;
- scan generator means connected to the deflection means;
- detector means for receiving signals from the specimen resulting from the electron beam scanning the specimen and outputting the measured signal dependent on scan rate;
- the detector means connecting to broad-band evaluation circuit means having a band-pass filter tuned to said frequency F and a following demodulation means;
- a narrow-band evaluation circuit means also connecting to the detector means and having a band-pass filter tuned to the frequency F and a following demodulator means;
- the broad-band evaluation circuit means connecting to a comparator means for determining when the frequency F is present and for outputting a signal to switch the scan generator means from a relatively higher deflection frequency to a relatively lower deflection frequency; and
- evaluation means connected to an output of the narrowband evaluation circuit means for evaluating an output signal therefrom.

* * * * *